(12) United States Patent
Wildstrom et al.

(10) Patent No.: US 11,606,085 B1
(45) Date of Patent: Mar. 14, 2023

(54) APPROXIMATION OF A RANGE OF SIDEBAND FREQUENCIES EFFICIENTLY

(71) Applicant: International Business Machines Corporation, Armonk, NY (US)

(72) Inventors: Jonathan Allen Wildstrom, Austin, TX (US); Oliver Dial, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/552,561

(22) Filed: Dec. 16, 2021

(51) Int. Cl.
*H03K 5/00* (2006.01)
*H03K 5/01* (2006.01)

(52) U.S. Cl.
CPC ........................................ *H03K 5/01* (2013.01)

(58) Field of Classification Search
CPC ............................................................ H03K 5/01
USPC ............................................................. 327/291
See application file for complete search history.

(56) References Cited

U.S. PATENT DOCUMENTS

| | | | |
|---|---|---|---|
| 7,408,486 B2 | 8/2008 | Kilbank | |
| 2004/0207548 A1* | 10/2004 | Kilbank | H03M 7/30 |
| | | | 341/107 |
| 2021/0250125 A1* | 8/2021 | Park | H04L 27/2614 |
| 2021/0320831 A1* | 10/2021 | Park | H04L 27/2621 |
| 2021/0344540 A1* | 11/2021 | Park | H04L 5/0098 |
| 2022/0147855 A1* | 5/2022 | Dial | G01R 31/52 |
| 2022/0278877 A1* | 9/2022 | Park | H04L 5/0094 |

* cited by examiner

*Primary Examiner* — Ryan Jager
(74) *Attorney, Agent, or Firm* — Amin, Turocy & Watson, LLP

(57) ABSTRACT

Systems, computer-implemented methods, and computer program products to facilitate approximating a range of sideband frequencies efficiently are provided. According to an embodiment, a system can comprise a processor that executes computer executable components stored in memory. The computer executable components comprise a wave division component that generates a plurality of waveform snippets using a definition of an intended waveform, wherein the plurality of waveform snippets can be phase shifted. The computer executable components further comprise rotation component that assigns a phase rotation to be applied to at least one waveform snippet of the plurality of waveform snippets, wherein the phase rotation is out of phase with a previous waveform snippet of the plurality of waveform snippets.

25 Claims, 11 Drawing Sheets

US 11,606,085 B1

APPROXIMATION OF A RANGE OF SIDEBAND FREQUENCIES EFFICIENTLY

BACKGROUND

The subject disclosure relates to waveform generation, and more specifically, to approximating a range of sideband frequencies efficiently.

Waveform generation has a wide range of uses in radio frequency (RF) technology. Many of these uses, including such areas as Rabi spectroscopy, as well as testing RF filters, attenuators, and transmission cables, and operation of quantum computers use frequency sweeps. In order to generate frequency sweeps, existing waveform generation technology generates a series of waveforms that are identical except for output frequency.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, and/or computer program products that facilitate approximating a range of sideband frequencies efficiently.

According to an embodiment, a system can comprise a processor that executes computer executable components stored in memory. The computer executable components comprise a wave division component that generates a plurality of waveform snippets using a definition of an intended waveform, wherein the plurality of waveform snippets can be phase shifted. The computer executable components further comprise a rotation component that assigns a phase rotation to be applied to at least one waveform snippet of the plurality of waveform snippets, wherein the phase rotation is out of phase with a previous waveform snippet of the plurality of waveform snippets. An advantage of such a system is that it can efficiently store an approximation of the intended waveform in memory by dividing the intended waveform into the plurality of waveform snippets.

In some embodiments, the rotation component assigns the phase rotation to be applied by the waveform generator to the at least one waveform snippet of the plurality of waveform snippets using a phase rotation factor of $2\pi(\omega+\varepsilon)t$, where t is a time at which the at least one waveform snippet of the plurality of waveform snippets is played by the waveform generator, and $\omega+\varepsilon$ is the frequency of the intended waveform. An advantage of such a system is that it can use the at least one waveform snippet of the plurality of waveform snippets to approximate the intended waveform.

According to another embodiment, a computer-implemented method can comprise generating, by a system operatively coupled to a processor, a plurality of waveform snippets using a definition of an intended waveform, wherein the plurality of waveform snippets can be phase shifted. The computer-implemented method can further comprise assigning, by the system, a phase rotation to be applied to at least one waveform snippet of the plurality of waveform snippets, wherein the phase rotation is out of phase with a previous waveform snippet of the plurality of waveform snippets. An advantage of such a computer-implemented method is that it can efficiently store an approximation of the intended waveform in memory by dividing the intended waveform into the plurality of waveform snippets.

In some embodiments, the above computer-implemented method can further comprise assigning, by the system, the phase rotation to be applied by the waveform generator to the at least one waveform snippet of the plurality of waveform snippets using a phase rotation factor of $2\pi(\omega+\varepsilon)t$, where t is a time at which the at least one waveform snippet of the plurality of waveform snippets is played by the waveform generator, and $\omega+\varepsilon$ is the frequency of the intended waveform. An advantage of such a computer-implemented method is that it can use the at least one waveform snippet of the plurality of waveform snippets to approximate the intended waveform.

According to another embodiment, a computer program product comprising a computer readable storage medium having program instructions embodied therewith, the program instructions executable by a processor to cause the processor to generate, by the processor, a plurality of waveform snippets using a definition of an intended waveform, wherein the plurality of waveform snippets can be phase shifted. The program instructions are further executable by the processor to cause the processor to assign, by the processor, a phase rotation to be applied to at least one waveform snippet of the plurality of waveform snippets, wherein the phase rotation is out of phase with a previous waveform snippet of the plurality of waveform snippets. An advantage of such a computer program product is that it can efficiently store an approximation of the intended waveform in memory by dividing the intended waveform into the plurality of waveform snippets.

In some embodiments, the program instructions are further executable by the processor to cause the processor to assign the phase rotation to be applied to the at least one waveform snippet of the plurality of waveform snippets using a phase rotation factor of $2\pi(\omega+\varepsilon)t$, where t is a time at which the at least one waveform snippet of the plurality of waveform snippets is played by the waveform generator, and $\omega+\varepsilon$ is the frequency of the intended waveform. An advantage of such a computer program product is that it can use the at least one waveform snippet of the plurality of waveform snippets to approximate the intended waveform.

According to an embodiment, a system can comprise a processor that executes computer executable components stored in memory. The computer executable components comprise a wave division component that generates a plurality of waveform snippets using a definition of a resource waveform, wherein a phase slip can be inserted between each waveform snippet of the plurality of waveform snippets. The computer executable components further comprise a phase slip component that assigns the phase slip to be inserted between at least two waveform snippets of the plurality of waveform snippets. An advantage of such a computer program product is that it can efficiently store an approximation of an intended waveform by dividing the resource wave into the plurality of waveform snippets.

DETAILED DESCRIPTION

Figure 1A:
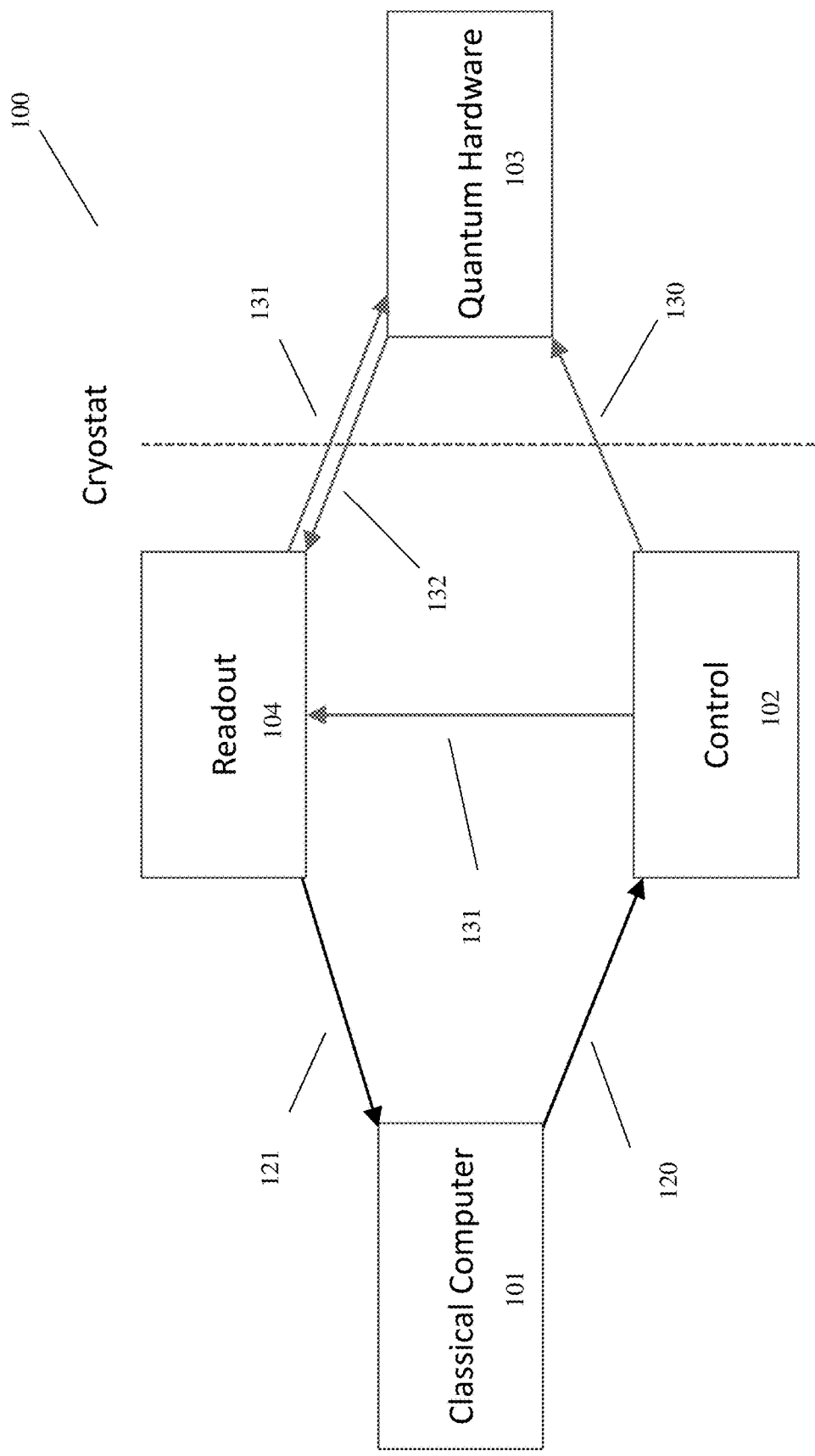
FIG. 1A illustrates a block diagram of an example, non-limiting system that can facilitate operation of quantum hardware in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, where like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, which can entangle multiple quantum bits and can use interference. This quantum superposition allows quantum systems to store and represent large data sets that are difficult to represent classically. Quantum computing has the potential to solve problems that, due to computational complexity, cannot be solved or can only be solved slowly on a classical computer. In many forms of quantum computers, the qubits within the quantum computer are operated through the use of radio frequency waves. As such, quantum computer can receive an instruction from a classical input, and then perform the instruction through the use of waveforms to operate the qubits within the quantum computer. Therefore, efficient waveform generation is important to the efficient operation of quantum computers.

A problem with existing waveform generation is that generating series of waveforms identical except for the output frequency, such as those used for a frequency sweeps, is highly memory intensive as each waveform is represented as a series of points, or samples, are implemented independently and stored in classical memory. A waveform generator can then use the samples as a set of instructions on how to play a waveform. The implementation or generation of the samples can have a large impact on the time it takes to play a series of waveforms as it takes time to generate samples for the entirety of a waveform as well as requiring large amount of classical memory and computations to accomplish.

Given the problems described above with existing waveform generation technologies, the present disclosure can be implemented to produce a solution to these problems in the form of systems, computer-implemented methods, and/or computer program products that can facilitate approximating a range of sideband frequencies efficiently by: generating a plurality of waveform snippets using a definition of an intended waveform, wherein the plurality of waveform snippets can be phase shifted; and/or assigning a phase rotation to be applied to at least one waveform snippet of the plurality of waveform snippets, wherein the phase rotation is out of phase with a previous waveform snippet of the plurality of waveform snippets. An advantage of such systems, computer-implemented methods, and/or computer program products is that they can decrease the memory workload used in order to generate a waveform. For example, the plurality of waveform snippets can comprise identical waveform snippets. As such, a sample representing a single waveform can be generated and reused to represent the plurality of waveform snippets as opposed to generating samples representing the entirety of the intended waveform.

In some embodiments, the present disclosure can be implemented to produce a solution to the problems described above in the form of systems, computer-implemented methods, and/or computer program products that can further facilitate approximating a range of sideband frequencies efficiently by: assigning the phase rotation to be applied to the at least one waveform snippet of the plurality of waveform snippets using a phase rotation factor of $2\pi(\omega+\varepsilon)t$, where t is the time at which the at least one waveform snippet of the plurality of waveform snippets is played by a waveform generator, and $\omega+\varepsilon$ is the frequency of the intended waveform, and/or playing the one or more waveform snippets with the phase rotation by a waveform generator. An advantage of such systems, computer-implemented methods, and/or computer program products is that they can use the at least one waveform snippet of the plurality of waveform snippets to approximate the intended waveform without needing to generate and store samples representing the entire intended waveform in memory. For example, the waveform generator can play the waveform snippet repeatedly with a different phase rotation each time in order to approximate the intended waveform. In this manner, the waveform generator can play an approximation of the intended waveform without samples representing the entirety of the intended waveform.

Turning first generally to FIG. 1A, one or more embodiments described herein can include one or more devices, systems and/or apparatuses that can facilitate executing one or more quantum operations to facilitate output of one or more quantum results. For example, FIG. 1A illustrates a block diagram of an example, non-limiting system 100 that can facilitate operation of quantum hardware.

In one or more embodiments system 100 can comprise a classical computer 101, a control system 102, quantum hardware 103, and/or a readout system 104. Classical computer 101 can output a quantum job request as a digital signal 120 to control system 102. Based on digital signal 120, control system 102 can play, via a waveform generator, a microwave signal in order to facilitate completion of the quantum job. For example, control system 102 can play, via a waveform generator, microwave signal 130 in order to operate and/or manipulate qubits within quantum hardware 103 to perform the quantum job request. In another example, control system 102 can play, via a waveform generator, microwave signal 131 to readout system 104. Readout system 104 can repeat microwave signal 131 to operate and/or manipulate qubits within quantum hardware 103 to output a microwave signal 132 of the quantum state of the qubits within quantum hardware 103. Readout system 104 can then translate microwave signal 132 into digital signal 121 and send digital signal 121, containing the quantum state of one or more qubits within quantum hardware 103, to classical computer 101.

Figure 1B:
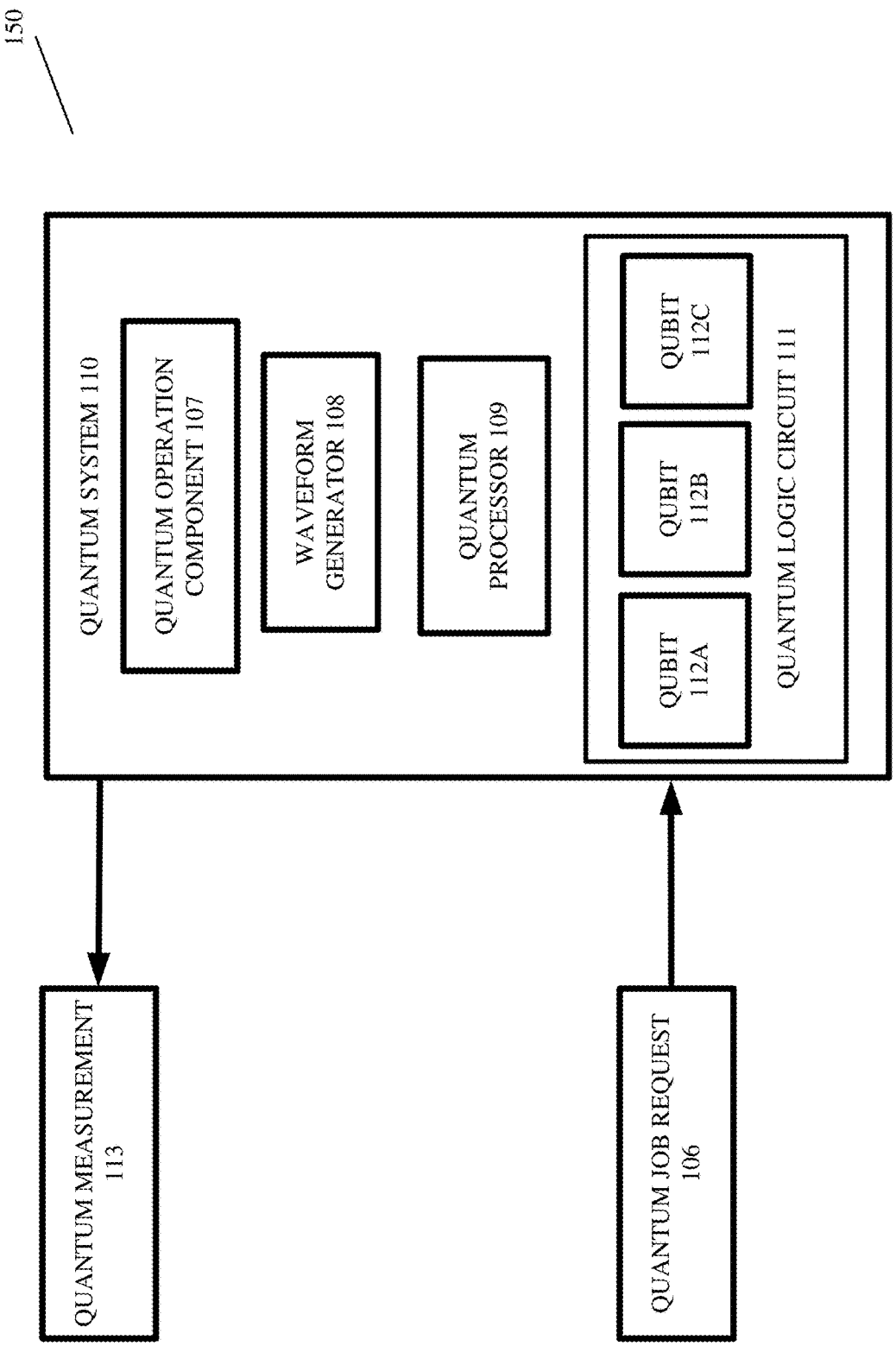
FIG. 1B illustrates a block diagram of an example, non-limiting system that can complete execution of a quantum job in accordance with one or more embodiments described herein.

Turning now generally to FIG. 1B, one or more embodiments described herein can include one or more devices, systems and/or apparatuses that can facilitate executing one or more quantum operations to facilitate output of one or more quantum results. For example, FIG. 1B illustrates a block diagram of an example, non-limiting system 150 that can complete the execution of a quantum job.

The quantum system 110 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 113, can be responsive to the quantum job request 106 and associated input data and can be based at least in part on the input data, quantum functions and/or quantum computations.

In one or more embodiments, the quantum system 110 can comprise one or more quantum components, such as a quantum operation component 107, a quantum processor 109 and a quantum logic circuit 111 comprising one or more qubits (e.g., qubits 112A, 112B and/or 112C), also referred to herein as qubit devices 112A, 112B and 112C. The quantum processor 109 can be any suitable processor, such as being capable of controlling qubit coherence and the like. The quantum processor 109 can generate one or more instructions for controlling the one or more processes of the quantum operation component 107.

The quantum operation component 107 that can obtain (e.g., download, receive, search for and/or the like) a quantum job request 106 requesting execution of one or more quantum programs. In an example, quantum job request 106 can be a digital signal. The quantum operation component 107 can determine one or more quantum logic circuits, such as the quantum logic circuit 111, for executing the quantum program. The request 106 can be provided in any suitable format, such as a text format, binary format and/or another suitable format. In one or more embodiments, the request 106 can be received by a component other than a component of the quantum system 110, such as a by a component of a classical system coupled to and/or in communication with the quantum system 110.

The quantum operation component 107 can perform one or more quantum processes, calculations and/or measurements for operating one or more quantum circuits on the one or more qubits 112A, 112B and/or 112C. For example, the quantum operation component 107 can operate one or more qubit effectors, such as waveform generator 108, qubit oscillators, harmonic oscillators, pulse generators and/or the like to cause one or more pulses to stimulate and/or manipulate the state(s) of the one or more qubits 112A, 112B and/or 112C comprised by the quantum system 110. That is, the quantum operation component 107, such as in combination with the quantum processor 109, can execute operation of a quantum logic circuit on one or more qubits of the circuit (e.g., qubit 112A, 112B and/or 112C). The quantum operation component 107 can output one or more quantum job results, such as one or more quantum measurements 113, in response to the quantum job request 106.

It will be appreciated that the following description(s) refer(s) to the operation of a single quantum program from a single quantum job request. However, it also will be appreciated that one or more of the processes described herein can be scalable, such as execution of one or more quantum programs and/or quantum job requests in parallel with one another.

In one or more embodiments, the non-limiting system 150 can be a hybrid system and thus can include both one or more classical systems, such as a quantum program implementation system, and one or more quantum systems, such as the quantum system 110. In one or more other embodiments, the quantum system 110 can be separate from, but function in combination with, a classical system.

In such case, one or more communications between one or more components of the non-limiting system 150 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

Figure 2:
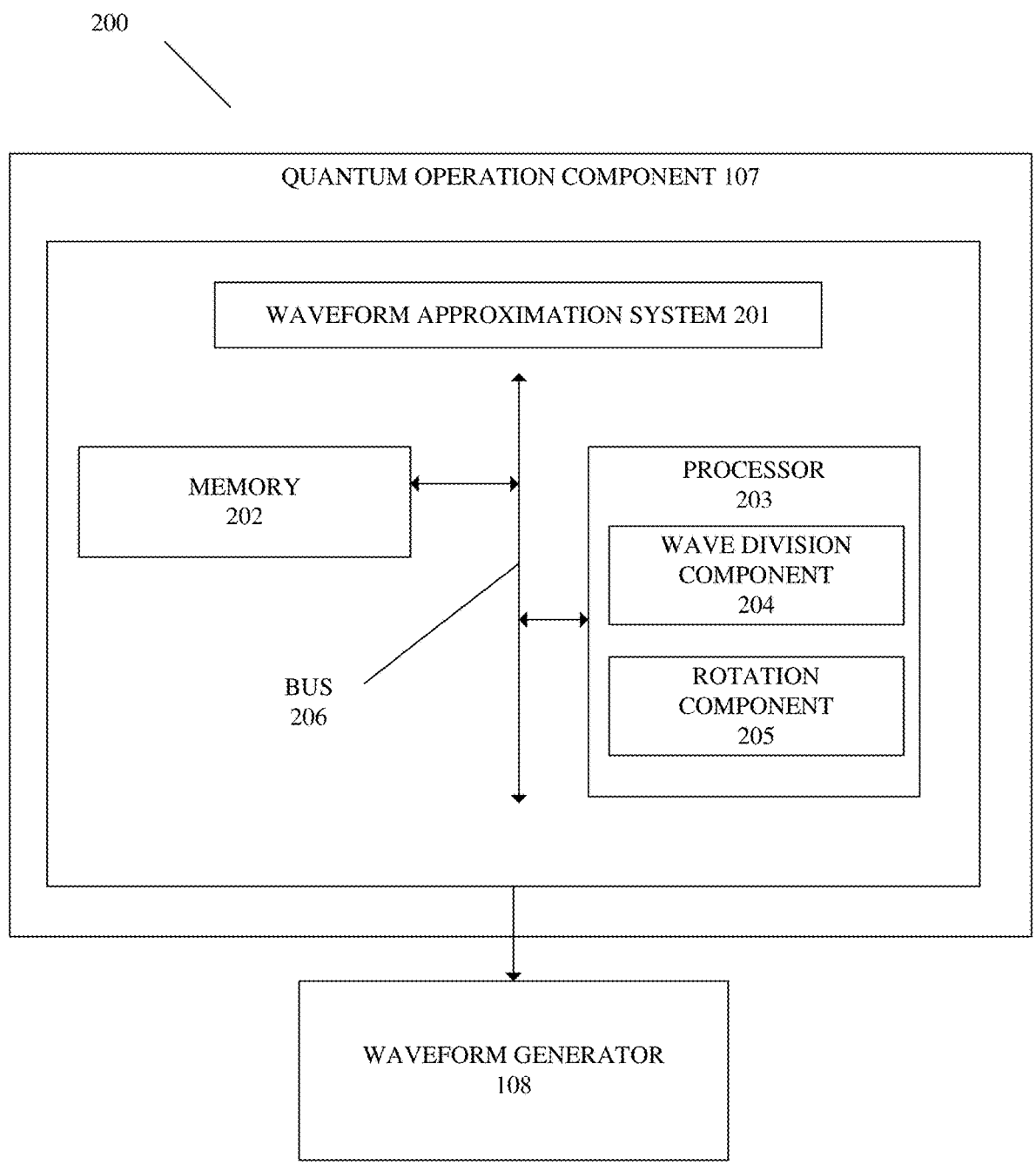
FIGS. 2 and 3 illustrate block diagrams of example non-limiting systems that can each facilitate approximating a range of sideband frequencies efficiently in accordance with one or more embodiments described herein.
Figure 3:
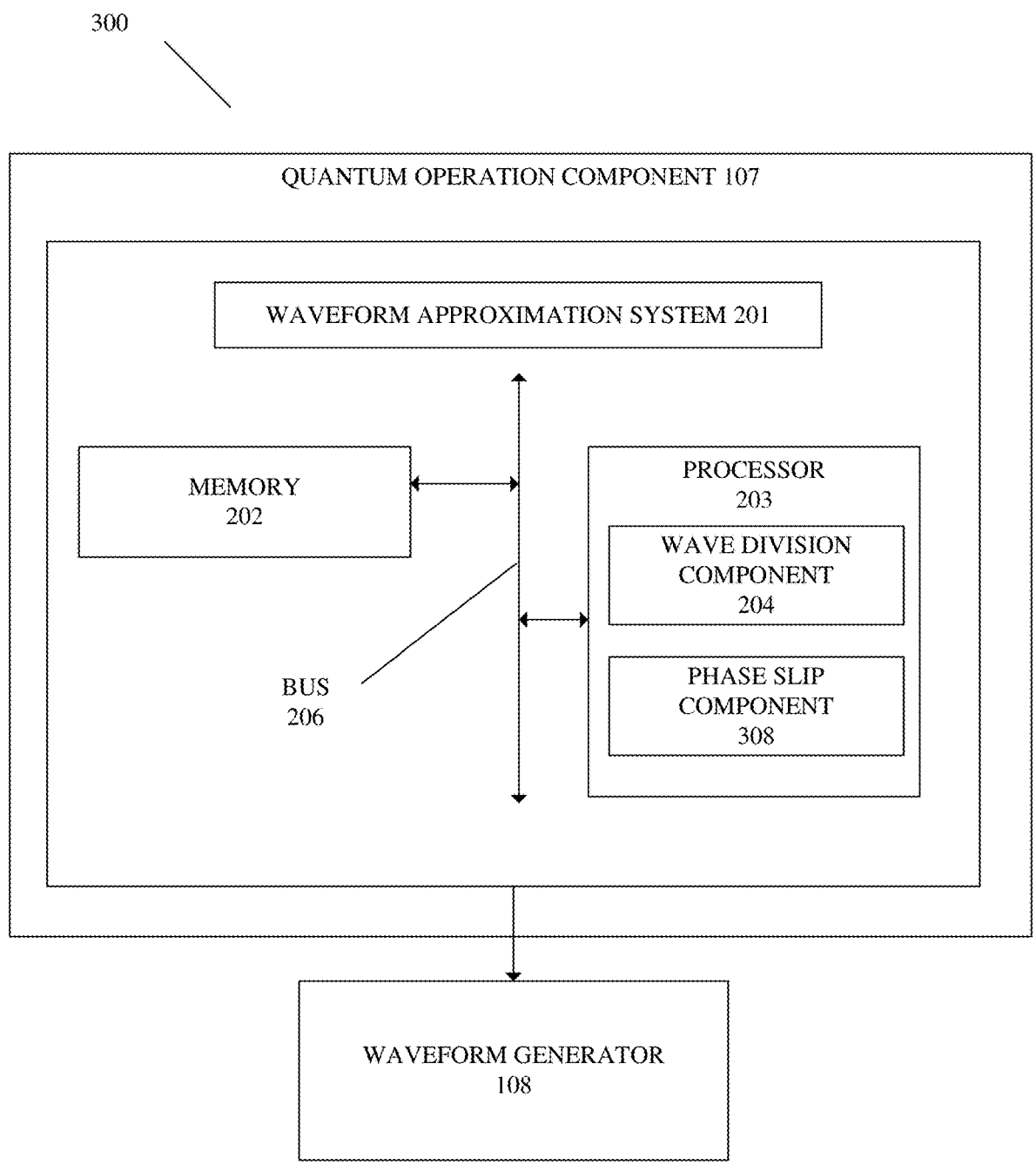

FIGS. 2 and 3 illustrate block diagrams of example non-limiting systems 200 and 300 respectively, that can each facilitate approximating a range of sideband frequencies efficiently in order to assist in operation of quantum system 110 in accordance with one or more embodiments described herein. System 200 and 300 can each comprises a quantum operation component 107 of quantum system 110. Quantum operation component 107 can comprise waveform approximation system 201. In an embodiment, quantum operation component 107 can receive a quantum job request 106. Based on quantum job request 106, quantum operation component 107 can define a waveform to be used by a waveform generator to operate, simulate, and/or manipulate the state of one or more qubits, such as qubits 112A, 112B, and/or 112C to facilitate performance of the quantum job request 106. For example, quantum operation component 107 can provide, as input, a definition of an intended waveform to waveform approximation system 201. Waveform approximation system 201 can generate one or more samples and/or instructions that when provided to waveform generator 108, cause waveform generator 108 to play an approximation of the defined waveform to operate qubits 112A, 112B, and/or 112C. Waveform approximation system 201 can comprise a memory 202, a processor 203, a wave division component 204, a rotation component 205, and/or a bus 206. Waveform approximation system 201 of system 300 depicted in FIG. 3 can further comprise a phase slip component 308.

It should be appreciated that the embodiments of the subject disclosure depicted in various figures disclosed herein are for illustration only, and as such, the architecture of such embodiments are not limited to the systems, devices, and/or components depicted therein. For example, in some embodiments, system 100, system 150, system 200, system 300, and/or waveform approximation system 201 can further comprise various computer and/or computing-based elements described herein with reference to operating environment 1000 and FIG. 10. In several embodiments, such computer and/or computing-based elements can be used in connection with implementing one or more of the systems, devices, components, and/or computer-implemented operations shown and described in connection with FIG. 1A, FIG. 1B, FIG. 2, FIG. 3, and/or other figures disclosed herein.

Memory 202 can store one or more computer and/or machine readable, writable, and/or executable components and/or instructions that, when executed by processor 203 (e.g., a classical processor, a quantum processor, and/or another type of processor), can facilitate performance of operations defined by the executable component(s) and/or instruction(s). For example, memory 202 can store computer and/or machine readable, writable, and/or executable components and/or instructions that, when executed by processor 203, can facilitate execution of the various functions described herein relating to waveform approximation system 201, wave division component 204, rotation component 205, waveform generator 108, phase slip component 308 and/or another component associated with waveform approximation system 201 as described herein with or without reference to the various figures of the subject disclosure.

Memory 202 can comprise volatile memory (e.g., random access memory (RAM), static RAM (SRAM), dynamic RAM (DRAM), and/or another type of volatile memory) and/or non-volatile memory (e.g., read only memory (ROM), programmable ROM (PROM), electrically programmable ROM (EPROM), electrically erasable programmable ROM (EEPROM), and/or another type of non-volatile memory) that can employ one or more memory architectures. Further examples of memory 202 are described below with reference to system memory 1016 and FIG. 10. Such examples of memory 202 can be employed to implement any embodiments of the subject disclosure.

Processor 203 can comprise one or more types of processors and/or electronic circuitry (e.g., a classical processor, and/or another type of processor and/or electronic circuitry) that can implement one or more computer and/or machine readable, writable, and/or executable components and/or instructions that can be stored on memory 202. For example, processor 203 can perform various operations that can be specified by such computer and/or machine readable, writable, and/or executable components and/or instructions including, but not limited to, logic, control, input/output (I/O), arithmetic, and/or the like. In some embodiments, processor 203 can comprise one or more central processing unit, multi-core processor, microprocessor, dual microprocessors, microcontroller, System on a Chip (SOC), array processor, vector processor, quantum processor, and/or another type of processor. Further examples of processor 203 are described below with reference to processing unit 1014 and FIG. 10. Such examples of processor 203 can be employed to implement any embodiments of the subject disclosure.

Waveform approximation system 201, memory 202, processor 203, wave division component 204, rotation component 205, waveform generator 108, phase slip component 308, and/or another component of waveform approximation system 201 as described herein can be communicatively, electrically, operatively, and/or optically coupled to one another via bus 206 to perform functions of system 100, system 150, system 200, system 300, waveform approximation system 201, and/or any components coupled therewith. Bus 206 can comprise one or more memory bus, memory controller, peripheral bus, external bus, local bus, a quantum bus, and/or another type of bus that can employ various bus architectures. Further examples of bus 206 are described below with reference to system bus 1018 and FIG. 10. Such examples of bus 206 can be employed to implement any embodiments of the subject disclosure.

Waveform approximation system 201 can comprise any type of component, machine, device, facility, apparatus, and/or instrument that comprises a processor and/or can be capable of effective and/or operative communication with a wired and/or wireless network. All such embodiments are envisioned. For example, waveform approximation system 201 can comprise a server device, a computing device, a general-purpose computer, a special-purpose computer, a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

Waveform approximation system 201 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) using a wire and/or a cable. For example, waveform approximation system 201 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) using a data cable including, but not limited to, a High-Definition Multimedia Interface (HDMI) cable, a recommended standard (RS) 232 cable, an Ethernet cable, and/or another data cable.

In some embodiments, waveform approximation system 201 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) via a network. For example, such a network can comprise wired and/or wireless networks, including, but not limited to, a cellular network, a wide area network (WAN) (e.g., the Internet) or a local area network (LAN). Waveform approximation system 201 can communicate with one or more external systems, sources, and/or devices, for instance, computing devices using virtually any desired wired and/or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. Therefore, in some embodiments, waveform approximation system 201 can comprise hardware (e.g., a central processing unit (CPU), a transceiver, a decoder, quantum hardware, a quantum processor, and/or other hardware), software (e.g., a set of threads, a set of processes, software in execution, quantum pulse schedule, quantum circuit, quantum gates, and/or other software) or a combination of hardware and software that can facilitate communicating information between waveform approximation system 201 and external systems, sources, and/or devices (e.g., computing devices, communication devices, and/or another type of external system, source, and/or device).

Waveform approximation system 201 can comprise one or more computer and/or machine readable, writable, and/or executable components and/or instructions that, when executed by processor 203 (e.g., a classical processor and/or another type of processor), can facilitate performance of operations defined by such component(s) and/or instruction(s). Further, in numerous embodiments, any component associated with waveform approximation system 201, as described herein with or without reference to the various figures of the subject disclosure, can comprise one or more computer and/or machine readable, writable, and/or executable components and/or instructions that, when executed by processor 203, can facilitate performance of operations defined by such component(s) and/or instruction(s). For example, wave division component 204, rotation component 205, waveform generator 108, phase slip component 308, and/or any other components associated with waveform approximation system 201 as disclosed herein (e.g., communicatively, electronically, operatively, and/or optically coupled with and/or employed by waveform approximation system 201), can comprise such computer and/or machine readable, writable, and/or executable component(s) and/or instruction(s). Consequently, according to numerous embodiments, waveform approximation system 201 and/or any components associated therewith as disclosed herein, can employ processor 203 to execute such computer and/or machine readable, writable, and/or executable component(s) and/or instruction(s) to facilitate performance of one or more operations described herein with reference to waveform approximation system 201 and/or any such components associated therewith.

Waveform approximation system 201 can facilitate (e.g., via processor 203) performance of operations executed by and/or associated with wave division component 204, rotation component 205, waveform generator 108, phase slip component 308, and/or any such component associated with waveform approximation system 201 as disclosed herein. For example, as described in detail below, waveform approximation system 201 can facilitate generating a plurality of waveform snippets, wherein the plurality of waveform snippets can be phase shifted, assigning a phase rotation to be applied to at least one waveform snippet of the plurality of waveform snippets at playtime, wherein the phase rotation is out of phase with a previous waveform snippet of the plurality of waveform snippets by using a rotation factor of $2\pi(\omega+\varepsilon)t$, where t is the time at which the at least one waveform snippets is played and $\omega+\varepsilon$ is the frequency of the intended waveform; and/or playing the at least one waveform snippet of the plurality of waveform snippets with the phase rotation by a waveform generator.

Wave division component 204 can generate a plurality of waveform snippets, wherein the waveform snippets can be phase shifted. As referenced herein, the "intended waveform" is the waveform which waveform generator 108 plays an approximation of and "waveform snippet" is a small portion of a waveform. Additionally, as referenced herein, a "sample" is a numeric data point which can be used to represent a waveform. In an embodiment, wave division component 204 can receive a definition of an intended waveform. For example, as described above, quantum operation component 107 can receive a quantum job request 106. Based on the quantum job request 106, quantum operation component 107 can define an intended waveform to be played to manipulate and/or operate qubits 112A, 112B, and/or 112C in order to perform quantum job request 106. Quantum operation component 107 can define the intended waveform as $S_r=A(t)e^{i\omega_r t}$, wherein A(t) is a narrowband envelope and $\omega_r$ is a target carrier angular frequency. Rather than generating and storing samples for the entire intended waveform, waveform division component can generate a sample representing a waveform snippet of the intended waveform of length $\tau$. In an embodiment, this waveform snippet can be used repeatedly to represent a plurality of waveform snippets. For example, the sample for the waveform snippet can be stored in memory along with a number of times to reuse the waveform snippet in the plurality of waveform snippets. In an embodiment, the waveform snippet can be phase shifted at playtime. By ensuring the generated waveform snippets can be phase shifted at playtime, waveform generator 108 can play an approximation of the intended waveform by adding a phase rotation to at least one waveform snippet of a plurality of waveform snippets when the at least one waveform snippet is played in order to manipulate and/or operate qubits 112A, 112B, and/or 112C to perform quantum job request 106. In an embodiment, a waveform snippet can be phased shifted by setting the starting phase rotation of the waveform snippets of the plurality of waveform snippets as zero (with a phase-agnostic sideband frequency).

In an embodiment, the intended waveform can be a frequency sweep. As described herein, a frequency sweep is a series of identical waveforms except for different output frequencies. For example, quantum operation component 107 can define a frequency sweep as a series of intended waveform definitions. As such, given an intended frequency sweep comprising two intended waveforms, quantum operation component 107 can define the first waveform as $S_r = A(t)e^{i\omega_r t}$ and the second waveform as $S_{r+1} = A(t)e^{i\omega_{r+1} t}$. In this example, waveform division component 204 can generate a sample representing a waveform snippet of the first waveform $S_r$ that can be phase shifted.

In an embodiment, wave division component 204 can determine the length, τ, of the waveform snippets based on the accuracy of the approximation. For example, the smaller the length r of the waveform snippets, the more accurate the approximation will be. Thus, if performance of quantum job request 106 calls for a high level of accuracy in the waveform approximation, wave division component can generate a waveform snippet of a small length τ. If the performance of quantum job request 106 calls for a lower level of accuracy in the waveform approximation, wave division component 204 can generate a waveform snippet of a longer length τ. In an embodiment, wave division component 204 can receive as input an intended accuracy level of the approximation and/or a length r from quantum operation component 107.

In another embodiment, wave division component 204 can determine the length of the waveform snippet based on the wavelength of the intended waveform. For example, if quantum operation component 107 defines an intended waveform that is intended to be played for two wavelengths, wave division component 204 can generate a waveform snippet of length τ, wherein τ is equal to one wavelength, and therefore wave division component 204 can generate a plurality of waveform snippets by defining a number of times the waveform snippet is to be played, in this case twice. It should be appreciated that wave division component 204 can generate waveform snippets of any length τ. For example, r may be shorter or longer than a wavelength of the intended waveform.

It should be appreciated that by generating a sample of a waveform snippet that can be phase shifted, wave division component 204 can improve waveform generation. For example, rather than generating samples to represent the entirety of the series of waveforms in a frequency sweep, wave division component 204 can generate a plurality of waveform snippets using a sample of a single waveform snippet generated from the definition of the initial waveform in the series of waveforms within the frequency sweep and a number of times to reuse the waveform snippet. In this example, by performing the above-described generation operation, wave division component 204 can reduce memory usage and/or time involved with generating a frequency sweep by allowing a single waveform snippet to represent the plurality of waveform snippets in memory, rather than generating samples for the entirety of the series of identical waveforms. In this example, by reducing memory usage and/or time involved with waveform approximation, wave division component 204 can thereby improve such a waveform approximation process.

Rotation component 205 can assign a phase rotation to be applied to at least one waveform snippet of the plurality of waveform snippets, wherein the phase rotation is out of phase with a previous waveform snippet of the plurality of waveform snippets. For example, rotation component 205 can assign a phase rotation using a constant complex multiplier which allows a waveform snippet to be phase rotated to an appropriate starting phase by waveform generator 108. For instance, if the intended wave envelope is a square pulse, sidebanded at normalized frequency ω=1/64 (i.e., 64 samples are used to represent a wavelength) rotation component 205 can use a phase rotation factor of $2\pi\omega t$, where t is the time a waveform snippet is to be played to assign a phase rotation to be used by waveform generator 108 at playtime. In this example, rotation component 205 can assign a phase rotation to be applied to at least one waveform snippet of the plurality of waveform snippets at playtime. For instance, given an intended waveform defined by quantum operation component 107 that wave division component 204 has generated a plurality of waveform snippets comprising four identical waveform snippets, rotation component 205 can assign a phase rotation for a first waveform snippet of 0 (complex multiplier 1+0j), a phase rotation for a second waveform snippet of π/2 (complex multiplier 0+1), a phase rotation for a third waveform snippet of π (complex multiplier −1+0j), and a phase rotation for a fourth waveform snippet of 3π/2 (complex multiplier 0−1j). The plurality of waveform snippets and the series of corresponding phase rotations can then be passed to waveform generator 108. For example, waveform generator 108 can play the first waveform snippet, using the sample representing the waveform snippet stored in memory, with the phase rotation of 0. Waveform generator 108 can then play the second waveform snippet, using the sample representing the waveform snippet in memory, with the phase rotation of π/2. Waveform generator 108 can then play the third and fourth waveform snippet with the corresponding third and fourth phase rotations. By playing the four waveform snippets with the corresponding phase rotations in sequence, waveform generator 108 can play an approximation of the intended waveform in order to operate and/or manipulate qubits 112A, 112B, and/or 112C to perform quantum job request 106. As stated above, when wave division component 204 generates a waveform snippet based on the definition of the intended waveform, wave division component 204 can store a sample for the single waveform snippet and use the single waveform snippet to represent each waveform in the plurality of waveform snippets used by waveform generator 108 to create the approximation of the intended waveform. Therefore, rotation component 205 can enable waveform generator 108 to extend the approximation of the intended waveform indefinitely to approximate a continuous waveform by enabling waveform generator 108 to replay the single waveform snippet stored with a new phase rotation assigned by rotation component 205 each time the waveform snippet is replayed.

In another embodiment, rotation component 205 can assign a phase rotation to be applied to at least one of the waveform snippets of the plurality of waveform snippets by waveform generator 108, wherein the waveform snippets approximate a frequency sweep when played by waveform generator 108 with the phase rotations. As noted above, a frequency sweep can be described as a series of identical waveforms except for different output frequencies. For example, if the intended waveform defined by quantum operation component 107 is a frequency sweep, then the frequency of the intended waveform can be defined as ω+ε, where ω is an initial frequency of the frequency sweep and ε is a change in frequency. If the intended waveform is a frequency sweep, then rotation component 205 can assign phase rotations using a phase rotation factor of $2\pi(\omega+\varepsilon)t$, wherein ω is an initial frequency of the frequency sweep (e.g., the frequency of the first waveform in the series of waveforms), ε is a change in frequency, and t is the time that the waveform snippet is played by waveform generator 108. If wave division component 204 generates a plurality of waveform snippets comprising four identical waveform snippets, then rotation component 205 can assign a phase rotation to a first waveform snippet using a first ε value in the rotation factor, assign a phase rotation to a second waveform snippet using a second ε value in the rotation factor, assign a phase rotation to a third waveform snippet using a third ε value, and assign a phase rotation to a fourth waveform snippet using a fourth ε value. Rotation component 205 can then pass the plurality of waveform snippets and corresponding phase rotations to waveform generator 108.

In an embodiment, the ε value can be determined based on the difference between the frequency of the first waveform in the series of waveform representing the frequency sweep and the current waveform. For example, an intended frequency sweep comprising two waveforms can be defined by quantum operation component 107 as $S_r=A(t)e^{i\omega_r t}$ and as $S_{r+1}=A(t)e^{i\omega_{r+1} t}$. If wave division component 204 generates a plurality of waveform snippets comprising four waveform snippets (e.g., a single waveform snippet of $S_r$ to be used four times), then rotation component 205 can determine four ε values. As there are two waveforms in the intended frequency sweep and there are four waveform snippets in the plurality of waveform snippets, in this example the first two waveform snippets will be used to represent $S_r$ and the second two waveform snippets will be used to represent $S_{r+1}$. Therefore, rotation component 205 can determine that the ε value for the first and second waveform snippet will be 0, as the first and second waveform snippet have the same output frequency as the initial output frequency. Rotation component 205 can determine the third and fourth ε value by finding the difference between $\omega_r$, the frequency of the initial waveform in the frequency sweep, and $\omega_{r+1}$, the current waveform being approximated in the frequency sweep.

In this example, by varying the ε value when assigning a phase rotation, rotation component 205 can assign phase rotations that allow waveform generator 108 to play the waveform snippet at different frequencies. In an embodiment, rotation component 205 can utilize a different ε value to assign a different phase rotation to be applied by waveform generator 108 each time waveform generator 108 plays the waveform snippet. In another embodiment, rotation component 205 can utilize the same ε value to assign phase rotations for multiple waveform snippets in the plurality of waveform snippets if multiple waveform snippets are to be played with the same output frequency by waveform generator 108.

In an embodiment, rotation component 205 can assign a phase rotation to be applied by waveform generator 108 to at least one waveform snippet of the plurality of waveform snippets prior to playtime. For example, if wave division component generates a plurality of waveform snippets comprising four identical waveform snippets, then rotation component 205 can assign corresponding phase rotations to the plurality of waveform snippets and pass the plurality of waveform snippets and corresponding phase rotations to waveform generator 108. In another embodiment, rotation component 205 can assign a phase rotation to be applied by waveform generator to a waveform snippet at playtime. For example, wave division component 204 can pass the plurality of waveform snippets to waveform generator 108. Waveform generator 108 can then request a phase rotation to play with a first waveform snippet of the plurality of waveform snippets. Rotation component 205 can assign a phase rotation as described above and pass the phase rotation to waveform generator 108. Waveform generator 108 can then play the first waveform snippet with the phase rotation. Waveform generator 108 can then request a phase rotation to play with a second waveform snippet of the plurality of waveform snippets. This process can be continued until waveform generator 108 has played all waveform snippets within the plurality of waveform snippets.

For example, if the waveform snippet is to be played by waveform generator 108 four times, then rotation component 205 can provide waveform generator 108 with a phase rotation to apply before each time the waveform snippet is played.

It should be appreciated that by assigning a phase rotation for a waveform snippet as described above, rotation component 205 can improve efficiency in approximating waveforms. For example, by assigning a phase rotation with a different frequency for each waveform snippet, wherein each waveform snippet is identical, an approximation of a frequency sweep can be played by waveform generator 108 using a single waveform snippet and a series of phase rotations, rather than using samples representing the entirety of the frequency sweep. In this example, rotation component 205 can reduce the storage used to play an approximation of a frequency sweep as the frequency sweep can be stored as a single waveform snippet and a series of phase rotations rather than as samples for the entirety of the frequency sweep. By reducing storage usage (e.g., memory usage), rotation component 205 can improve efficiency in waveform approximation.

Waveform generator 108 can play at least one waveform snippet of the plurality of waveform snippets with a phase rotation. For example, waveform generator 108 can receive a plurality of waveform snippets from wave division component 204 and one or more phase rotations from rotation component 205. As described above, the plurality of waveform snippets can comprise identical waveform snippets. As such the plurality of waveform snippets can be represented as a single waveform snippet and a number of times to play the single waveform snippet. In this example, if waveform generator 108 receives a plurality of waveform snippets comprising four waveform snippets and receives four corresponding phase rotation factors, waveform generator can play a first waveform snippet of the plurality of waveform snippets with a first phase rotation, a second waveform snippet with a second phase rotation, a third waveform snippet with a third phase rotation, and a fourth waveform snippet with a fourth phase slip. By playing the four identical waveform snippets in sequence with the corresponding phase rotation, waveform generator 108 can play an approximation of the intended waveform defined by quantum operation component 107 and thus operate and/or manipulate qubits 112A, 112B, and/or 112C in order to perform quantum job request 106.

In another embodiment, waveform generator 108 can receive a plurality of waveform snippets and request phase rotations from rotation component 205. For example, if waveform generator 108 receives a plurality of waveform snippets comprising four waveform snippets, waveform generator can request a phase rotation from rotation component 205 for a first waveform snippet. Once waveform generator 108 receives a phase rotation from rotation component 205, waveform generator 108 can play the first waveform snippet with the phase rotation. Waveform generator 108 can then request a second phase rotation for a second waveform snippet. Once waveform generator 108 receives the second phase rotation, waveform generator 108 can play the second waveform snippet with the second phase rotation. This process can repeat until waveform generator 108 has played all waveform snippets in the plurality of waveform snippets. Waveform generator 108 can be a signal generator, a function generator, a radio frequency generator, a microwave signal generator, a digital pattern generator, a frequency generator, a pitch generator, an arbitrary waveform generator, and/or any other form of electronic test equipment which can output waveforms.

In some embodiment, the present disclosure can be implemented to produce a solution to the problems described above in the form of systems, computer-implemented methods, and/or computer program products that can further facilitate approximating a range of sideband frequencies efficiently by: generating a plurality of waveform snippets, wherein a phase slip can be inserted before each waveform snippet of the plurality of waveform snippets, assigning a phase slip to be inserted before at least one of the waveform snippets of the plurality of waveform snippets, and/or playing the phase slip and the at least one waveform snippet of the plurality of waveform snippets.

In an embodiment, wave division component 204 can generate a waveform snippet of a resource waveform. For example, wave division component 204 can receive a definition of an intended waveform as $S_r=A(t)e^{i\omega_r t}$ from quantum operation component 107 as described above. Wave division component 204 can additionally receive a definition of a resource waveform as $S_s=A(t)e^{i\omega_s t}$ wherein $\omega_s$ and $\omega_r$ are close and generate a sample representing a waveform snippet of length r based on the definition of the resource waveform rather than the definition of the intended waveform. Wave division component 204 can then represent a plurality of waveform snippets as the waveform snippet and a number of times the waveform snippet should be played by waveform generator 108. Phase slip component 308 can assign a phase slip to be inserted between at least two waveform snippets of the plurality of waveform snippets. In an embodiment, phase slip component 308 can assign a phase slip to be inserted before a waveform snippet is played by waveform generator 108. For example, given a definition of the intended waveform defined by quantum operation component 107 as $S_r=A(t)e^{i\omega_r t}$, at frequency $\omega_r$, where A(t) is a narrowband envelope and a definition of the resource waveform as $S_s=A(t)e^{i\omega_s t}$ where $\omega_s$ is a sample angular frequency near to $\omega_r$, phase slip component 308 can assign a phase slip to be played by waveform generator 108 between two waveform snippets as $\delta_\varphi=\tau(\omega_r-\omega_s)$. In order to make the average rate of phase advance for the approximated signal correct, phase slip component 308 can assign a phase-jump, s(t), to be applied to the phase slip, wherein the phase-jump is assigned using sawtooth function $$s(t) = \left(\frac{t}{\tau} - \left\lfloor\frac{1}{2} + \frac{t}{\tau}\right\rfloor\right).$$

As such, phase rotation component 308 can assign a phase slip, with a corresponding phase-jump, to be inserted before one or more waveform snippets of the plurality of waveform snippets. For example, phase slip component 308 can receive a plurality of waveform snippets from wave division component comprising four waveform snippets. Phase slip component 308 can additionally receive the definitions of the intended waveform and the resource waveform. Phase slip component 308 can assign a first phase slip to be inserted between the first waveform snippet and the second waveform snippet using the definition $\delta_\varphi=\tau(\omega_r-\omega_s)$, the value of $\omega_r$ from the definition of intended waveform, the value of $\omega_s$ from the definition of the resource waveform, and the length, $\tau$, of the waveform snippet generated by wave division component 204. Phase slip component 308 can then assign a phase-jump to be applied to the first phase slip using the definition $$s(t) = \left(\frac{t}{\tau} - \left\lfloor\frac{1}{2} + \frac{t}{\tau}\right\rfloor\right),$$

wherein t is the time when the first phase slip will be inserted. Phase slip component 308 can then assign a second phase slip with a second phase-jump to be inserted between the second waveform snippet and the third waveform snippet and a third phase slip with a third phase-jump to be inserted between the third and fourth phase slips. Phase slip component 308 can then pass the plurality of waveform snippets and the series of phase slips and phase-jumps to waveform generator 108. For example, waveform generator 108 can play the first waveform snippet using the sample representing the waveform snippet in memory, then play the first phase slip with the first phase-jump, and then play the second waveform snippet. Waveform generator 108 can continue playing waveform snippets and phase slips until all waveform snippets in the plurality of waveform snippets have been played. By playing the waveform snippets with the phase slips inserted in between, waveform generator 108 can play an approximation of the intended waveform in order to operate and/or manipulate qubits 112A, 112B, and/or 112C to perform quantum job request 106.

In these examples, by assigning a phase slip with a phase-jump to be inserted before each time the waveform snippet is played, phase slip component 308 can enable waveform generator 108 to play an approximation of the intended waveform using the waveform snippet of the resource waveform and one or more phase slips.

Using the definition of the phase slip and the phase jump, the approximated signal can be defined as $S_g = A(t)e^{i(\omega_r t+\delta_\varphi s(t))}=S_r e^{i\delta_\varphi s(t)}$, wherein the imaginary part of the exponent, $\omega_r t+\delta_\varphi s(t)$, is the phase of the carrier wave. The amount of additional noise or error introduced to the approximated signal by adding the sawtooth can be seen by examining $S_g=S_r e^{i\delta_\varphi s(t)}$. Since s(t)<1 and $\delta_\varphi$ is small, the exponential is approximately $1+i\delta_\varphi s(t)$. Using the sin expansion of s(t), wherein k is an index of all phase slips in the approximate waveform:

$$s(t) = \frac{-1}{\pi}\sum_{k=1}^{\infty}\frac{(-1)^k}{k}\sin\frac{2\pi kt}{\tau} = \frac{-1}{2\pi i}\sum_{k=1}^{\infty}\frac{(-1)^k}{k}\left(e^{i\frac{2\pi kt}{\tau}} - e^{-i\frac{2\pi kt}{\tau}}\right)$$

This as a result gives:

$$S_g = S_r\left(1 + \frac{-i\delta_\varphi}{2\pi}\sum_{k=1}^{\infty}\frac{(-1)^k}{k}\left(e^{i\frac{2\pi kt}{\tau}} - e^{-i\frac{2\pi kt}{\tau}}\right)\right)$$

From this result, the 1 in parenthesis gives the intended waveform. The approximation adds a series of sidebands at frequencies $$\pm \frac{k}{\tau}$$

is the detuning from the source frequency ($\omega_s$), with amplitude $$\left|\frac{\delta_\varphi}{2\pi k}\right|. \text{ If } \Delta_f = \frac{\omega_r - \omega_s}{2\pi}$$

is the detuning between the target and source frequencies, then the sideband amplitude is $$\frac{\tau \Delta_f}{k},$$

or $$20 \log_{10}\left|\frac{\tau \Delta_f}{k}\right| dBc$$

(dB relative to carrier).

It should be appreciated that by assigning a phase slip to be inserted by waveform generator 108 before playing a waveform snippet, phase slip component 308 can improve waveform generation through the use of the sawtooth phase-jump function. As the sawtooth function is relatively easy to calculate, phase slip component 308 can enable waveform generator 108 to efficiently play an approximation of the intended waveform without the need to generate and store samples for the entire intended waveform in memory. As noted above, existing waveform generation technology is highly memory intensive, and by enabling waveform generator 108 to play an approximation of the intended waveform using a waveform snippet of the resource waveform, phase slip component 308 can enable waveform approximation system 201 to improve waveform generation and playing by reducing storage operations involved with waveform generation and playing.

Figure 4:
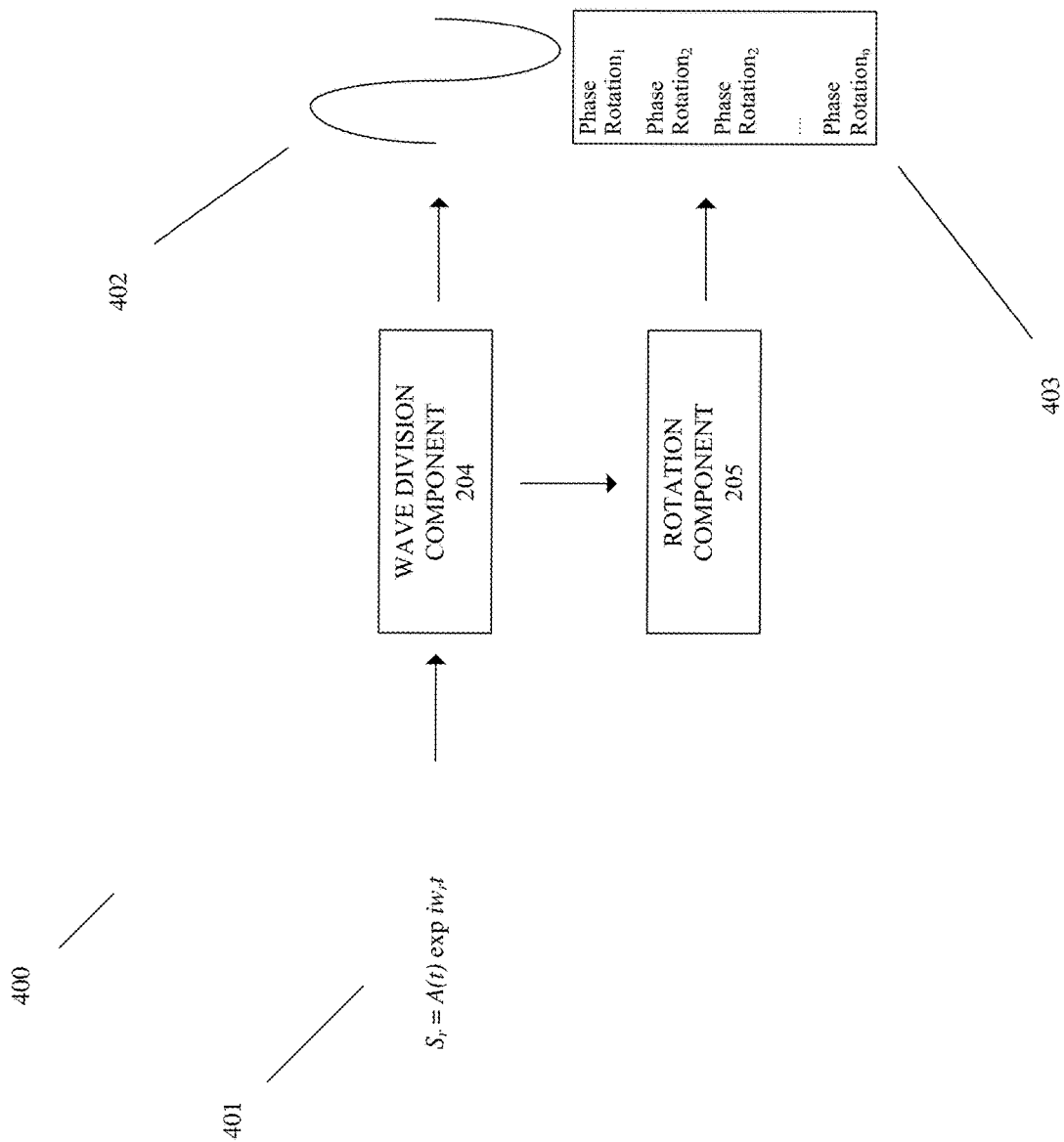
FIG. 4 illustrates a block diagram of an example, non-limiting system associated with division of an intended waveform into waveform snippets and determination of phase rotations in accordance with one or more embodiments described herein.

FIG. 4 illustrates a block diagram of an example, non-limiting system associated with generation of a waveform snippet and assignment of phase rotations in accordance with one or more embodiments described herein. Repetitive description of like elements employed in other embodiments described herein is omitted for sake of brevity.

The system 400 includes wave division component 204 of waveform approximation system 201. Wave division component 204 can receive a definition of intended waveform 401 from quantum operation component 107. Wave division component 204 can generate a plurality of waveform snippets by generating a sample for a single waveform snippet and a number of times the waveform snippet is to be played. As the plurality of waveform snippets comprises the same waveform snippet used repeatedly, wave division component 204 can store a single waveform snippet 402 for repeated use for each waveform snippet in the plurality of waveform snippets. Rotation component 205 can assign a series of phase rotations to be applied by the waveform generator 108 to the waveform snippet each time it is played. The sample representing the waveform snippet 402, the number of times to play the waveform snippet, and the series of phase rotations 403 can then be passed to waveform generator 108. Waveform generator 108 can then play an approximation of the intended waveform using the waveform snippet and the series of phase rotations as described in reference to FIG. 2 to operate and/or manipulate qubits 112A, 112B, and/or 112C to perform quantum job request 106. It should be appreciated that by carrying out these operations frequency sweep generation efficiency can be improved by generating a single waveform snippet and assigning a series of phase rotations rather generating samples representing the entirety of the intended waveform.

Figure 5:
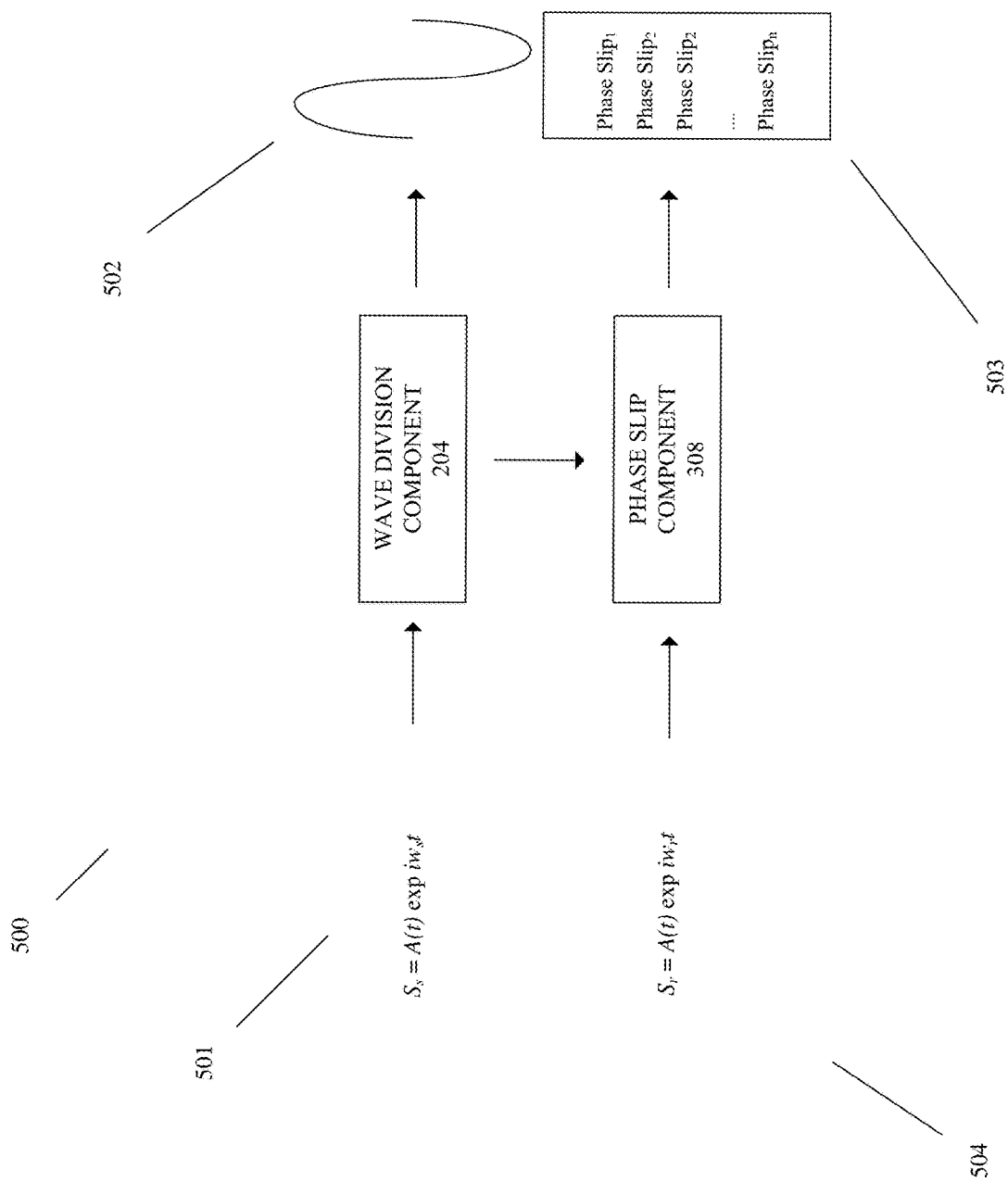
FIG. 5 illustrates a block diagram of an example, non-limiting system associated with division of a waveform into waveform snippets and determination of phase slips in accordance with one or more embodiments described herein.

FIG. 5 illustrates a block diagram of an example, non-limiting system associated with generation of a waveform snippet and assignment of phase slips in accordance with one or more embodiments described herein. Repetitive description of like elements employed in other embodiments described herein is omitted for sake of brevity.

The system 500 includes wave division component 204 of waveform approximation system 201. Wave division component 204 can receive a definition of resource waveform 501. Wave division component 204 can generate a plurality of waveform snippets by generating a sample of a single waveform snippet 502 and a number of times the waveform snippet is to be played by waveform generator 108. As the single waveform snippet 502 is reused to represent a plurality of waveform snippets, wave division component 204 can store a sample representing waveform snippet 502 for repeated use for each waveform snippet of the plurality of waveform snippets. Phase slip component 308 can receive a definition of an intended waveform 504 to be approximated from quantum operation component 107. Phase slip component 308 can assign a series of phase slips and phase-jumps to be inserted by waveform generator 108 between waveform snippets of the plurality of waveform snippets. The sample representing the waveform snippet 502, the number of times to play to waveform snippet, and the series of phase slips and phase-jumps 503 can then be passed to waveform generator 108. Waveform generator 108 can then play an approximation of the intended waveform using the waveform snippet 502 and the series of phase slips and phase-jumps as described in reference to FIG. 3 to operate and/or manipulate qubits 112A, 112B, and/or 112C to perform quantum job request 106. It should be appreciated that by carrying out these operations frequency sweep generation efficiency can be improved by generating a single waveform snippet and assigning a series of phase slips rather than generating samples representing the entirety of the intended waveform.

Figure 6:
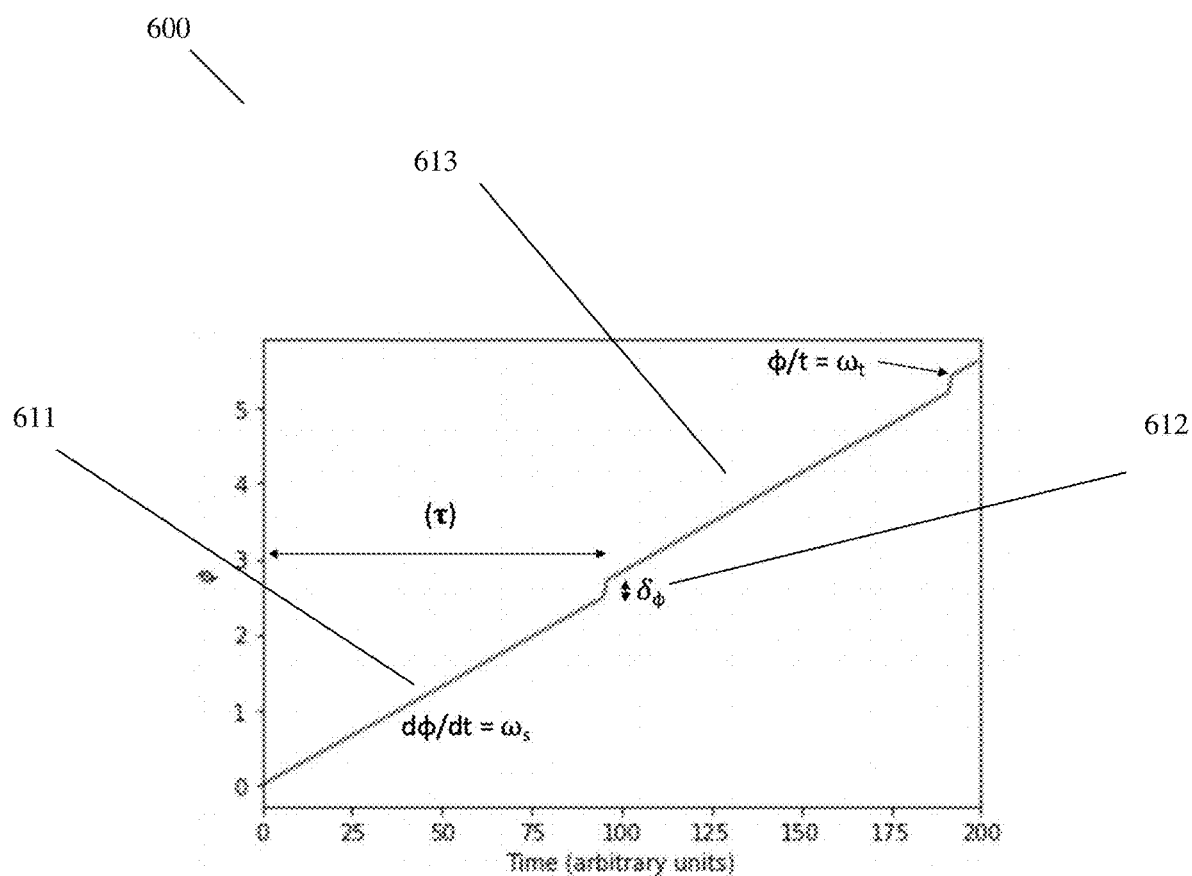
FIG. 6 illustrates a graph showing a carrier wave of an approximated waveform in accordance with one or more embodiments described herein.

FIG. 6 illustrates a graph 600 associated with a carrier wave of an approximated waveform in accordance with one or more embodiments described herein. Repetitive description of like elements and/or processes employed in respective embodiments is omitted for sake of brevity. As described above, phase slip component 308 can assign phase slips to be inserted between each time waveform generation 108 plays the waveform snippet of a resource wave to generate an approximated signal of $S_g = A(t)e^{i(\omega_r t + \delta_\varphi s(t))}$. As noted above, $\omega_r t + \delta_\varphi s(t)$ is the phase of the carrier wave. Graph 600 illustrates a graphical representation of the phase of the carrier wave defined as $\omega_r t + \delta_\varphi s(t)$. The x axis of graph 600 is time in arbitrary units, while the y axis is phase of the carrier wave. 611 represents a first time the waveform snippet of length $\tau$ is played (e.g., a first waveform snippet of the plurality of waveform snippets) by waveform generator 108, to play approximated signal $S_g = A(t)e^{i(\omega_r t + \delta_\varphi s(t))}$. 613 represents a second time the waveform snippet is played (e.g., a second waveform snippet of the plurality of waveform snippets) by waveform generator 108, play the approximated signal. 612 is a phase slip, assigned by phase slip component 308 and inserted by waveform generator 108 between the first playing of waveform snippet 611 and the second time of playing waveform snippet 613. Due to the insertion of phase slip 612, the second playing of waveform snippet 613 is out of phase with the first playing of the waveform snippet 611. It should be appreciated that as the length of waveform snippets increases, fewer phase slips are used, however height of the phase slips increases, and the approximation becomes less accurate. Conversely, when the length of waveform snippets is shortened, more phase slips are used, but the height of the phase slips decreases, and the approximation becomes more accurate. This is reflected in the spacing and amplitude of the sidebands discussed above with reference to FIG. 3 and phase slip component 308.

Figure 7:
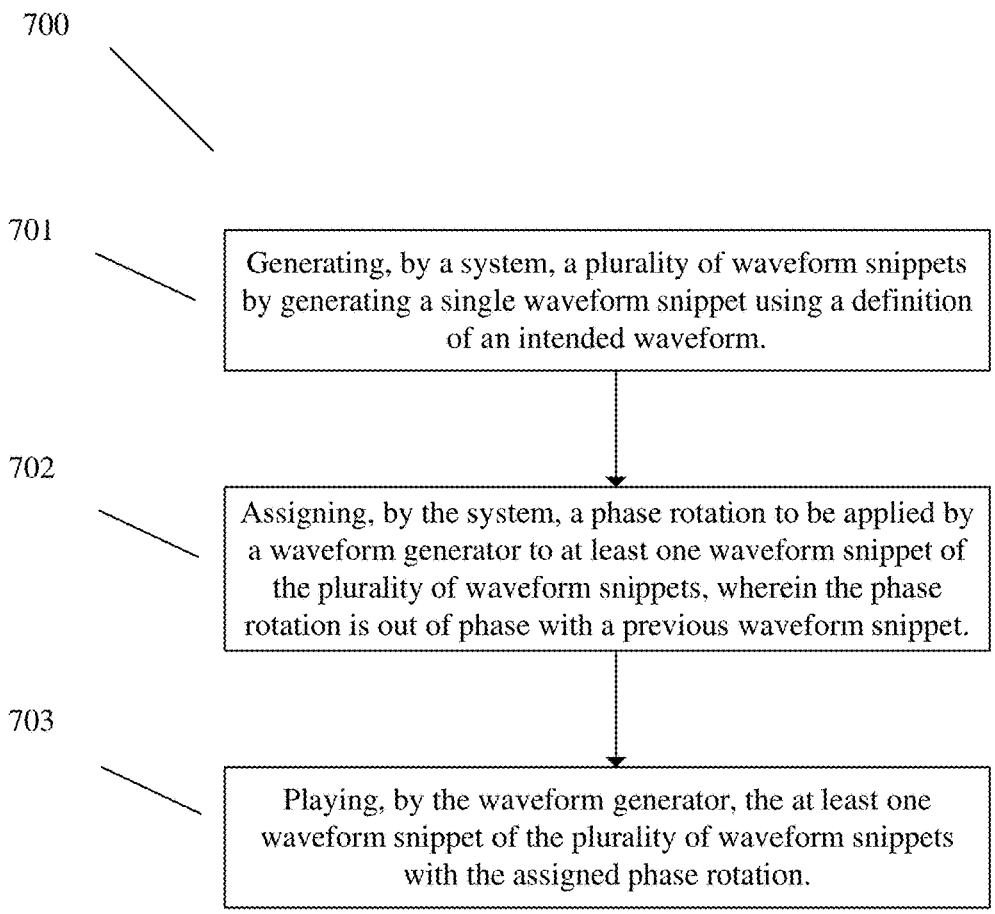
FIG. 7 illustrates a flow diagram of an example, non-limiting computer-implemented method that can facilitate approximating a range of sideband frequencies efficiently in accordance with one or more embodiments described herein.

FIG. 7 illustrates a flow diagram of an example, non-limiting computer-implemented method 700 that can facilitate approximating a range of sideband frequencies efficiently in accordance with one or more embodiments described herein. Repetitive description of like elements and/or processes employed in respective embodiments is omitted for sake of brevity.

At 701, computer-implemented method 700 can comprise generating, by a system (e.g., via waveform approximation system 201 and/or wave division component 204) operatively coupled to a processor (e.g., processor 203), a plurality of waveform snippets by generating a single waveform snippet using a definition of an intended waveform and a number of times to play the single waveform snippet.

At 702, computer-implemented method 700 can comprise assigning, by the system (e.g., via waveform approximation system 201 and/or rotation component 205), a phase rotation to be applied by a waveform generator (e.g., waveform generator 108) to at least one waveform snippet of the plurality of waveform snippets, wherein the phase rotation is out of phase with a previous waveform snippet of the plurality of waveform snippets.

At 703, computer-implemented method 700 can comprise playing, by a waveform generator, (e.g., waveform generator 108), the at least one waveform snippet of the plurality of waveform snippets with the assigned phase rotation.

Figure 8:
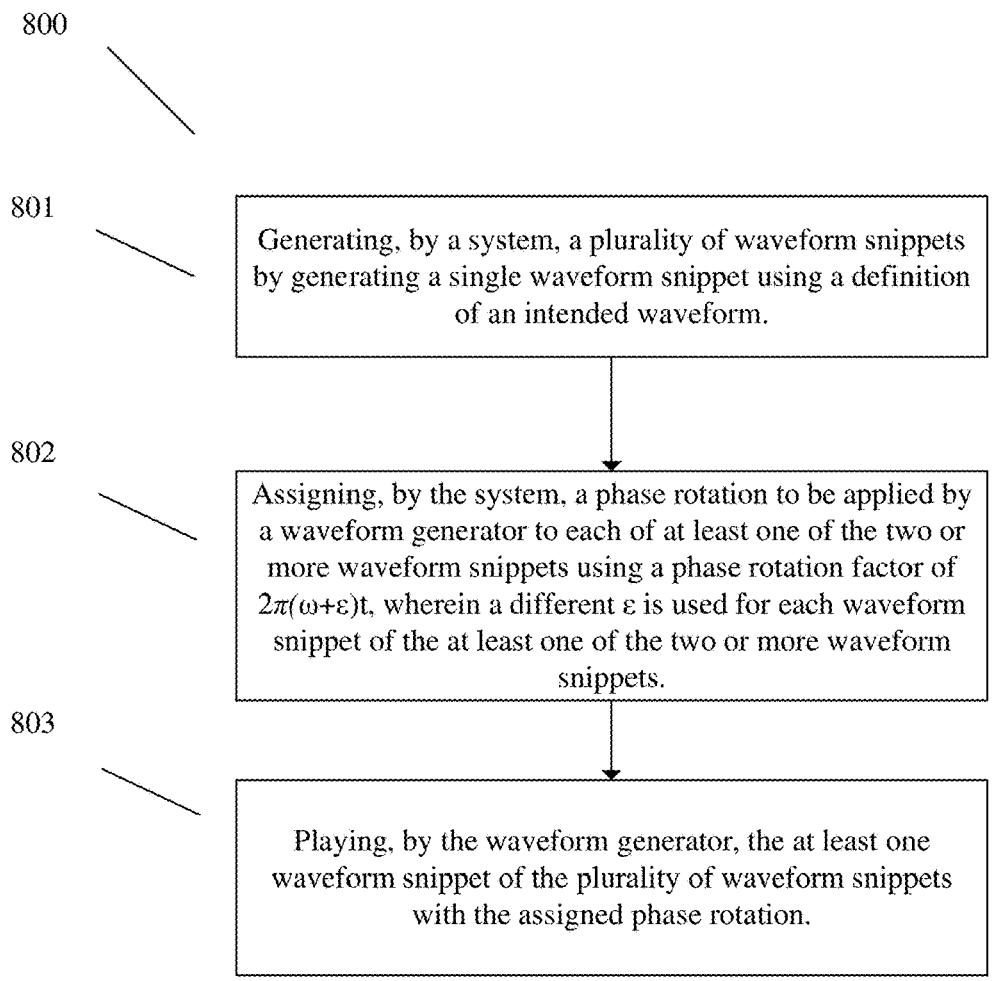
FIG. 8 illustrates a flow diagram of an example, non-limiting computer-implemented method that can facilitate approximating a range of sideband frequencies efficiently in accordance with one or more embodiments described herein.

FIG. 8 illustrates a flow diagram of an example, non-limiting computer-implemented method 800 that can facilitate approximating a range of sideband frequencies efficiently in accordance with one or more embodiments described herein. Repetitive description of like elements and/or processes employed in respective embodiments is omitted for sake of brevity.

At 801, computer-implemented method 800 can comprise generating, by a system (e.g., via waveform approximation system 201 and/or wave division component 204) operatively coupled to a processor (e.g., processor 203), a plurality of waveform snippets by generating a single waveform snippet using a definition of an intended waveform and a number of times to play the single waveform snippet.

At 802, computer-implemented method 800 can comprise assigning, by the system (e.g., via waveform approximation system 201 and/or rotation component 205), a different phase rotation to be applied by a waveform generator (e.g., waveform generator 108) to each waveform snippet of the plurality of waveform snippets using a phase rotation factor of $2\pi(\omega+\varepsilon)t$, wherein a different c value is used for each waveform snippet of the plurality of waveform snippets. In this example, as described above with reference to FIGS. 1 and 2, an approximated waveform can be stored as a single waveform snippet, used repeatedly to represent each waveform snippet of the plurality of waveform snippets and a corresponding phase rotation to be applied to each of the two of more waveform snippets.

At 803, computer-implemented method 800 can comprise playing, by a waveform generator, (e.g., waveform generator 108), the at least one waveform snippet of the plurality of waveform snippets with the assigned phase rotation. For example, as described above with reference to FIGS. 2 and 3, by playing the plurality of waveform snippets with a different phase rotations for various waveform snippets of the plurality of waveform snippets, waveform generator 108 can play an approximation of a frequency sweep as various waveform snippets of the plurality waveform snippets will have different output frequencies due to the application of a different phase rotation to various waveform snippets by waveform generator 108 when waveform generator 108 plays each waveform snippet.

Figure 9:
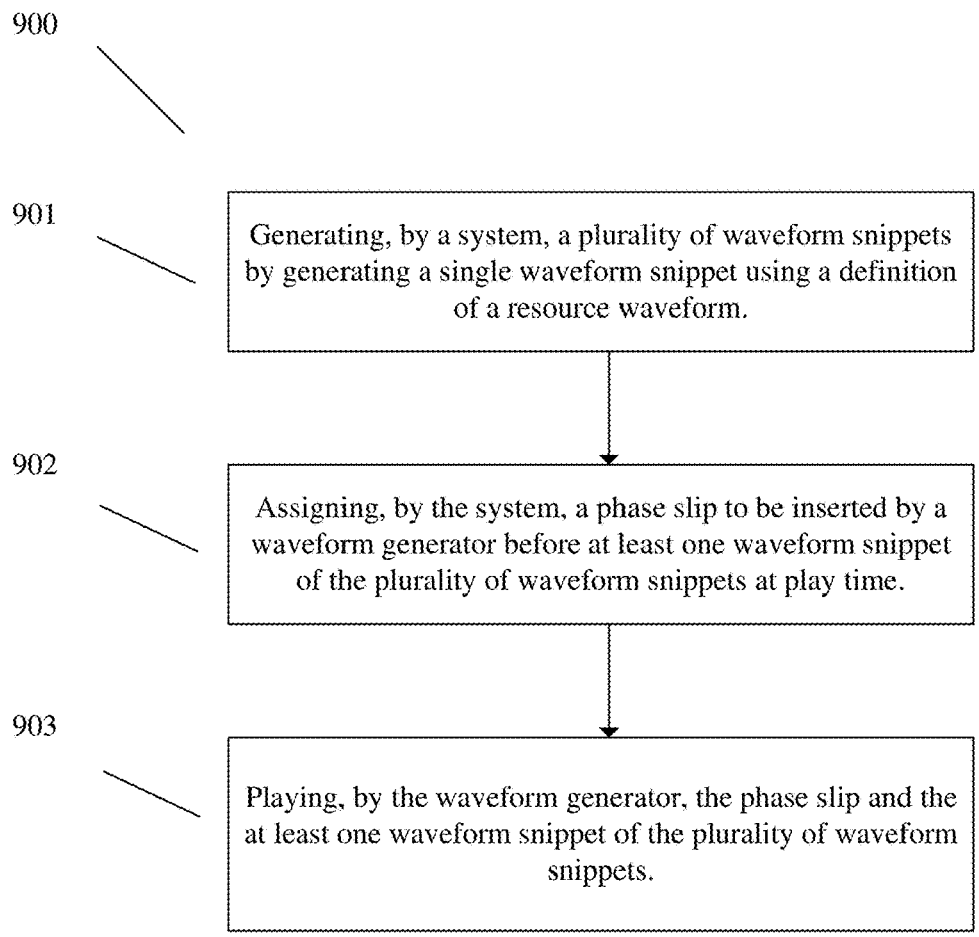
FIG. 9 illustrates a flow diagram of an example, non-limiting computer-implemented method that can facilitate approximating a range of sideband frequencies efficiently in accordance with one or more embodiments described herein.

FIG. 9 illustrates a flow diagram of an example, non-limiting computer-implemented method 900 that can facilitate approximating a range of sideband frequencies efficiently in accordance with one or more embodiments described herein. Repetitive description of like elements and/or processes employed in respective embodiments is omitted for sake of brevity.

At 901, computer-implemented method 900 can comprise generating, by a system (e.g., via waveform approximation system 201 and/or wave division component 204) operatively coupled to a processor (e.g., processor 203), a plurality of waveform snippets by generating a single waveform snippet using a definition of a resource waveform and a number of times to play the single waveform snippet. For example, as described above with reference to FIG. 3, by generating a waveform snippet of the resource signal which can have phase slips inserted before the waveform snippet by a waveform generator (e.g., waveform generator 108), waveform approximation system 201 can manipulate the waveform snippets in order to approximate and intended signal.

At 902, computer-implemented method 900 can comprise assigning, by the system (e.g., via waveform approximation system 201 and/or phase slip component 308), a phase slip to be inserted by a waveform generator before at least one waveform snippet of the plurality of waveform snippets. For example, as described in detail above with reference to FIG. 3, phase slip component 308 can assign a phase slip to be inserted by a waveform generator (e.g., waveform generator 108) using the definition of a phase slip as $\delta_\varphi = \tau(\omega_r - \omega_s)$ in conjunction with a sawtooth phase jump function defined as $$s(t) = \left( \frac{t}{\tau} - \left[ \frac{1}{2} + \frac{t}{\tau} \right] \right).$$

At 903, computer-implemented method 900 can comprise playing, by a waveform generator (e.g., waveform generator 108) the phase slip and the at least one waveform snippet of the plurality of waveform snippets.

Waveform approximation system 201 can be associated with various technologies. For example, waveform approximation system 201 can be associated with quantum technologies, RF technologies, microwave technologies, spectroscopy technology, and/or other technologies.

Waveform approximation system 201 can provide technical improvements to systems, devices, components, operational steps, and/or processing steps associated with the various technologies identified above. For example, waveform approximation system 201 can use waveform snippets of a resource waveform in order to generate an approximation of an intended waveform. In this example, waveform approximation system 201 can generate a plurality of waveform snippets using a single waveform snippet generated using a definition of the resource waveform. Waveform approximation system 201 can further assign phase slips to be inserted by a waveform generator (e.g., waveform generator) before each waveform snippet when the waveform snippet is played by the waveform generator (e.g., waveform generator 108). In this example, waveform approximation system 201 can play, via a waveform generator, the approximation of the intended waveform. In another example, waveform approximation system 201 can generate a waveform snippet using a definition of the intended waveform. Waveform approximation system 201 can assign a phase rotation to be applied to the waveform snippet by a waveform generator (e.g., waveform generator 108) each time the waveform generator plays the waveform snippet. In an embodiment, the phase rotation applied by the waveform generator can be different each time the waveform snippet is played, so that the output waveform approximates the intended waveform.

Waveform approximation system 201 can provide technical improvements to a memory unit associated with waveform approximation system 201. For example, by generating a single waveform snippet for repeated use, a waveform generator (e.g., waveform generator 108) can play an approximation of a frequency sweep, using phase rotations or phase slips, without the need to generate samples in memory representing the entirety of the frequency sweep, thereby reducing the usage of a memory unit (e.g., memory 202). In these examples, by reducing usage of such a memory unit (e.g., memory 202), waveform approximation system 201 can thereby facilitate improved performance, improved efficiency, and/or reduced computational cost associated with such a memory unit.

Additionally, by reducing usage of a memory unit, waveform approximation system 201 can provided technological improvements to operation of quantum systems. For example, by reducing usage of a memory unit, and the number of memory operations used, in generating waveforms to operate a quantum system, generation of waveforms can be performed faster, thereby enabling faster operation of the quantum system. Furthermore, by reducing usage of a memory unit, waveform approximation system 201 can enable the use of smaller and/or cheaper to produce memory units in the generation of waveforms.

It is to be appreciated that waveform approximation system 201 can utilize various combinations of electrical components, mechanical components, and circuitry that cannot be replicated in the mind of a human or performed by a human, as the various operations that can be executed by waveform approximation system and/or components thereof as described herein are operations that are greater than the capability of a human mind. For instance, the amount of data processed, the speed of processing such data, or the types of data processed by waveform approximation system 201 over a certain period of time can be greater, faster, or different than the amount, speed, or data type that can be processed by a human mind over the same period of time.

According to several embodiments, waveform approximation system 201 can also be fully operational towards performing one or more other functions (e.g., fully powered on, fully executed, and/or another function) while also performing the various operations described herein. It should be appreciated that such simultaneous multi-operational execution is beyond the capability of a human mind. It should also be appreciated that waveform approximation system 201 can include information that is impossible to obtain manually by an entity, such as a human user. For example, the type, amount, and/or variety of information included in waveform approximation system 201, wave division component 204, rotation component 205, waveform generator 108, and/or phase slip component 308 can be more complex than information obtained manually by an entity, such as a human user.

Waveform approximation system 201 can employ hardware or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, and/or another type of specialized computer) to execute defined tasks related to the various technologies identified above. Waveform approximation system 201 and/or components thereof, can be employed to solve new problems that arise through advancements in technologies mentioned above, employment of quantum computing systems, cloud computing systems, computer architecture, and/or another technology.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
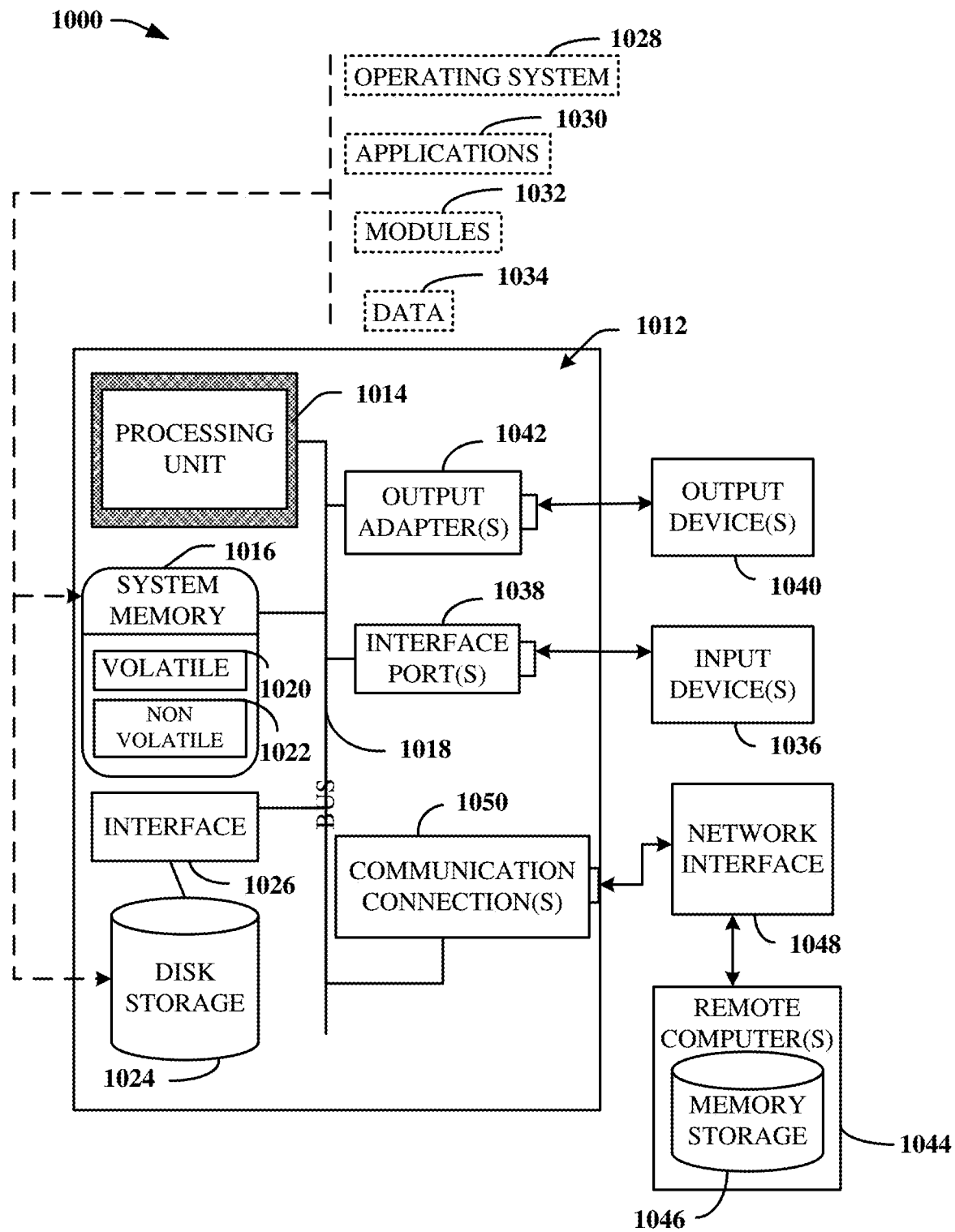
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s)

including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 2020 and nonvolatile memory 2022. The basic input/output system (BIOS), containing the basic routines to transfer information between elements within the computer 1012, such as during start-up, is stored in nonvolatile memory 2022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, and/or another wire and/or wireless communication network. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, and/or other program modules that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, where the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
   a memory that stores executable components:
   a processor that executes computer executable components stored in memory, wherein the computer executable components comprise:
   a wave division component that generates a plurality of waveform snippets using a definition of an intended waveform, wherein the plurality of waveform snippets can be phase shifted; and
   a rotation component that assigns a phase rotation to be applied to at least one waveform snippet of the plurality of waveform snippets, wherein the phase rotation is out of phase with a previous waveform snippet of the plurality of waveform snippets.

2. The system of claim 1, further comprising:
a waveform generator that plays the at least one waveform snippet of the plurality of waveform snippets with the phase rotation.

3. The system of claim 2, wherein the at least one waveform snippet of the plurality of waveform snippets played with the phase rotation by the waveform generator approximates a continuous waveform.

4. The system of claim 3, wherein the waveform snippets of the plurality of waveform snippets have a starting phase rotation of zero.

5. The system of claim 4, wherein the rotation component assigns the phase rotation to be applied by the waveform generator to the at least one waveform snippet of the plurality of waveform snippets using a phase rotation factor of $2\pi(\omega+\varepsilon)t$, where t is a time at which the at least one waveform snippet of the plurality of waveform snippets is played by the waveform generator, and $\omega+\varepsilon$ is the frequency of the intended waveform.

6. The system of claim 5, wherein the rotation component assigns a different phase rotation to be applied by the waveform generator to each waveform snippet of the plurality of waveform snippets by using a different $\varepsilon$ value for each waveform snippet of the plurality of waveform snippets.

7. The system of claim 6, wherein playing the plurality of waveform snippets with the different phase rotation for each waveform snippet of the plurality of waveform snippets by the waveform generator approximates a frequency sweep.

8. The system of claim 5, wherein the phase rotation to be applied to the at least one waveform snippet of the plurality of waveform snippets is assigned at playtime of the at least one waveform snippet of the plurality of waveform snippets.

9. A computer-implemented method comprising:
generating, by a system operatively coupled to a processor, a plurality of waveform snippets using a definition of an intended waveform, wherein the plurality of waveform snippets can be phase shifted; and
assigning, by the system, a phase rotation to be applied to at least one waveform snippet of the plurality of waveform snippets, wherein the phase rotation is out of phase with a previous waveform snippet of the plurality of waveform snippets.

10. The computer-implemented method of claim 9, further comprising:
playing, via a waveform generator, by the system, the at least one waveform snippet of the plurality of waveform snippets with the phase rotation.

11. The computer-implemented method of claim 10, wherein the at least one waveform snippet of the plurality of waveform snippets played with the phase rotation by the waveform generator approximates a continuous waveform.

12. The computer-implemented method of claim 11, wherein the plurality of waveform snippets have a starting phase rotation of zero.

13. The computer-implemented method of claim 12, wherein the system assigns the phase rotation to be applied by the waveform generator to the at least one waveform snippet of the plurality of waveform snippets using a phase rotation factor of $2\pi(\omega+\varepsilon)t$, where t is a time at which the at least one waveform snippet of the plurality of waveform snippets is played by the waveform generator, and $\omega+\varepsilon$ is the frequency of the intended waveform.

14. The computer-implemented method of claim 13, wherein the system assigns a different phase rotation to be applied by the waveform generator to each waveform snippet of the plurality of waveform snippets by using a different $\varepsilon$ value for each waveform snippet of plurality of waveform snippets.

15. The computer-implemented method of claim 14, wherein playing the plurality of waveform snippets with the different phase rotation for each waveform snippet of the plurality of waveform snippets by the waveform generator approximates a frequency sweep.

16. The computer-implemented method of claim 13, wherein the phase rotation to be applied to the at least one waveform snippet of the plurality of waveform snippets is determined at playtime of the at least one waveform snippet of the plurality of waveform snippets.

17. A computer program product, the computer program product comprising one or more computer readable storage media having program instructions embodied therewith, the program instructions executable by a processor to cause the processor to:
generate, by the processor, a plurality of waveform snippets using a definition of an intended waveform, wherein the plurality of waveform snippets can be phase shifted; and
assign, by the processor, a phase rotation to be applied to at least one waveform snippet of the plurality of waveform snippets, wherein the phase rotation is out of phase with a previous waveform snippet of the plurality of waveform snippets.

18. The computer program product of claim 17, the program instructions further executable by the processor to cause the processor to:
play, via a waveform generator, the at least one waveform snippet of the plurality of waveform snippets with the phase rotation.

19. The computer program product of claim 18, wherein the at least one waveform snippet of the plurality of waveform snippets played with the phase rotation by the waveform generator approximates a continuous waveform.

20. The computer program product of claim 19, wherein the plurality of waveform snippets have a starting phase rotation of zero.

21. The computer program product of claim 20, wherein the phase rotation to be applied to the at least one waveform snippet of the plurality of waveform snippets is assigned using a phase rotation factor of $2\pi(\omega+\varepsilon)t$, where t is a time at which the at least one waveform snippet of the plurality of waveform snippets is played by the waveform generator, and $\omega+\varepsilon$ is the frequency of the intended waveform.

22. The computer program product of claim 21, wherein the processor assigns a different phase rotation to be applied by the waveform generator to each waveform snippet of the plurality of waveform snippets by using a different c value for each waveform snippet of the plurality of waveform snippets.

23. The computer program product of claim 22, wherein the playing by the waveform generator of the plurality of waveform snippets with the different phase rotation for each waveform snippet of the plurality of waveform snippets approximates a frequency sweep.

24. The computer program product of claim 21, wherein the phase rotation to be applied to at least one waveform snippet of the plurality of waveform snippets is assigned at playtime of the at least one waveform snippet of the plurality waveform snippets.

25. A system comprising:

a memory that stores executable components:

a processor that executes computer executable components stored in memory, wherein the computer executable components comprise:
- a wave division component that generates a plurality of waveform snippets using a definition of a resource waveform, wherein a phase slip can be inserted between each waveform snippet of the plurality of waveform snippets; and
- a phase slip component that assigns the phase slip to be inserted between at least two waveform snippets of the plurality of waveform snippets.

* * * * *